United States Patent
Chen et al.

(10) Patent No.: US 8,163,607 B2
(45) Date of Patent: Apr. 24, 2012

(54) SEMICONDUCTOR DEVICE AND METHOD OF MAKING THE SAME

(75) Inventors: Yi-Wei Chen, Tai-Chung Hsien (TW); Nien-Ting Ho, Tainan (TW); Kuo-Chih Lai, Tai-Nan (TW); Chien-Chung Huang, Taichung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 173 days.

(21) Appl. No.: 12/769,649

(22) Filed: Apr. 29, 2010

(65) Prior Publication Data

US 2011/0266596 A1    Nov. 3, 2011

(51) Int. Cl.
*H01L 21/8283* (2006.01)
(52) U.S. Cl. ......... 438/199; 438/163; 438/301; 257/288
(58) Field of Classification Search .................. 438/163, 438/199, 301; 257/288, E29.255, E21.409, 257/E21.627
See application file for complete search history.

(56) References Cited

U.S. PATENT DOCUMENTS 6,077,750 A * 6/2000 Sohn et al. ................ 438/303
2002/0146904 A1* 10/2002 Buynoski et al. ............ 438/682

OTHER PUBLICATIONS

Y. Uchida, N. Katsumata, K. Ishida, Nickel-enhanced low-temperature epitaxial growth of silicon, Thin Solid Films, (2003), pp. 294-297, 427, Elsevier Science B.V.

M. Zhang, J. Knoch, Q.T. Zhao, U. Breuer, S. Mantl, Impact of dopant segregation on fully depleted Schottky-barrier SOI-MOSFETs, Solid-State Electronics, (2006), pp. 594-600, 50, Elsevier Ltd.

Zhen Zhang, Zhijun Qiu, Ran Liu, Mikael Ostling, and Shi-Li Zhang, Schottky-Barrier Height Tuning by Means of Ion Implantation Into Preformed Silicide Films Followed by Drive-In Anneal, IEEE Electron Device Letters, July 2007, pp. 565-568, vol. 28, No. 7, IEEE.

* cited by examiner

*Primary Examiner* — Theresa T Doan
(74) *Attorney, Agent, or Firm* — Winston Hsu; Scott Margo

(57) ABSTRACT

In a method of the present invention during a salicide process, before a second thermal process, a dopant is implanted at a place located in a region ranging from a $Ni_xSi$ layer at meddle height down to a front thereof, or before formation of the $Ni_xSi$ layer, located in a region ranging from a silicon layer at a depth ranging from a half of a predetermined thickness of a NiSi layer down to a depth where is a predetermined front of the NiSi layer. The dopant is allowed to be heated with the $Ni_xSi$ layer together during the second thermal process to form a $Si/NiSi_2/NiSi$ interface which may reduce SBH and improve series resistance to obtain a semiconductor device having an excellent performance.

8 Claims, 11 Drawing Sheets

SEMICONDUCTOR DEVICE AND METHOD OF MAKING THE SAME

BACKGROUND OF THE INVENTION

1. Field of the Invention

The present invention relates to a semiconductor manufacturing process, and particularly to a method of making a semiconductor device with a metal silicide layer on the top of a gate and a pair of source/drain and the semiconductor device.

2. Description of the Prior Art

As integration of elements in integrated circuits (IC) increases, line widths and geometries for semiconductor devices are reduced. Accordingly, resistance of a gate and source/drain regions of a MOS transistor made by conventional techniques is relatively high. To reduce resistance, a metal silicide layer is formed on the gate and the source/drain regions by a self-aligned silicide (salicide) process. Nickel silicide is commonly used as a salicide material. However, as the MOS is further scaled down, NiSi/Si interface Schottky barrier height (SBH) is becoming more and more important.

Furthermore, because the NiSi layer is formed by two thermal treatments, the temperature employed in the later one is higher. Under such temperature, silicon tends to aggregate to grow crystals, such that the NiSi layer is formed un-continuously and resistance is increased to affect the electric properties.

Therefore, there is still a need for a novel method of making a semiconductor device to overcome the aforesaid disadvantages to obtain a semiconductor device having a Si/NiSi interface with a low SBH and a low resistance.

SUMMARY OF THE INVENTION

An objective of the present invention is to provide a method of making a semiconductor device, by which SBH at NiSi/Si interface may be reduced.

The method of making a semiconductor device according to an embodiment of the present invention includes steps as follows. First, a substrate is provided. Next, a gate and a pair of source/drain doped regions are formed on the substrate. The gate and the pair of source/drain doped regions each independently comprise a doped silicon layer. A NiPt layer is blanketly deposited to cover the gate and the pair of source/drain doped regions. A cap layer is blanketly deposited on the NiPt layer. A first rapid thermal process (RTP) is performed on the substrate to allow Ni of the NiPt layer to react with silicon of the silicon layer to form a $Ni_xSi$ layer, wherein x represents a number in a range from 1 to 3. A selective etching process is performed to remove unreacted NiPt or the cap layer. A second RTP is performed on the substrate to allow the $Ni_xSi$ layer to further react with silicon to form a NiSi layer and a $NiSi_2$ layer. The $NiSi_2$ layer is disposed between the NiSi layer and the silicon layer. Among the aforesaid steps, an ion implantation is performed to implant a dopant into the $Ni_xSi$ layer at a depth ranging between a middle height of the $Ni_xSi$ layer and down to a front of the $Ni_xSi$ layer after performing the selective etching process and before performing the second RTP, or after performing the first RTP and before performing the selective etching process. Alternatively, the dopant is implanted into each silicon layer at a depth ranging between a half of a predetermined thickness of the NiSi layer and down to a predetermined front of the NiSi layer after depositing the cap layer and before performing the first RTP.

The method of making a semiconductor device according to another embodiment of the present invention includes steps as follows. First, a substrate is provided. The substrate comprises a first region and a second region. Next, a first gate and a pair of first source/first drain doped regions are formed in the first region of the substrate. The first gate and the pair of first source/first drain doped regions each independently comprise a first silicon layer which is doped. A second gate and a pair of second source/second drain doped regions are formed in the second region of the substrate. The second gate and the pair of second source/second drain doped regions each independently comprise a second silicon layer which is doped. A NiPt layer is blanketly deposited to cover the first gate, the pair of first source/first drain doped region, the second gate, and the pair of second source/second drain doped region. A cap layer is blanketly deposited on the NiPt layer. A first RTP is performed on the substrate to allow Ni of the NiPt layer to react with silicon of the first and second silicon layer to form a $Ni_xSi$ layer, wherein x represents a number in a range from 1.5 to 3. A selective etching process is performed to remove unreacted NiPt or the cap layer. A second RTP is performed on the substrate to allow the $Ni_xSi$ layer to further react with silicon to form a NiSi layer and a $NiSi_2$ layer. The $NiSi_2$ layer is disposed between the NiSi layer and the silicon layer. Among the aforesaid steps, an ion implantation is performed to implant a dopant into the $Ni_xSi$ layer at a depth ranging between a middle height of the $Ni_xSi$ layer and down to a front of the $Ni_xSi$ layer after performing the selective etching process and before performing the second RTP, or after performing the first RTP and before performing the selective etching process. Alternatively, the dopant is implanted into each silicon layer at a depth ranging between a half of a predetermined thickness of the NiSi layer and down to a predetermined front of the NiSi layer after depositing the cap layer and before performing the first RTP.

In another aspect of the present invention, the semiconductor device according to the present invention comprises a substrate and a transistor disposed on the substrate. The transistor comprises a gate and a pair of source/drain regions each comprising a silicon layer. A top of each of the gate and the pair of source/drain regions comprises a NiSi layer, a $NiSi_2$ layer disposed between the NiSi layer and the silicon layer, and a dopant having a normal distribution in a region ranging between the NiSi layer at a middle height and down to a front of the $NiSi_2$ layer.

These and other objectives of the present invention will no doubt become obvious to those of ordinary skill in the art after reading the following detailed description of the preferred embodiment that is illustrated in the various figures and drawings.

DETAILED DESCRIPTION

The method of the present invention may be utilized to make a MOS transistor, especially an n type MOS transistor, and also a CMOS device, in which an NMOS transistor and a PMOS transistor may be made at the same time. The flow chart of FIG. 1 and the schematic cross-sectional views of FIGS. 2 to 5 illustrate an embodiment of the method of making a semiconductor device according to the present invention. FIGS. 2 to 5 illustrate that an NMOS and a PMOS of a CMOS is made at the same time; yet, they also can be referred and realized for just making a NMOS transistor.

Figure 1:
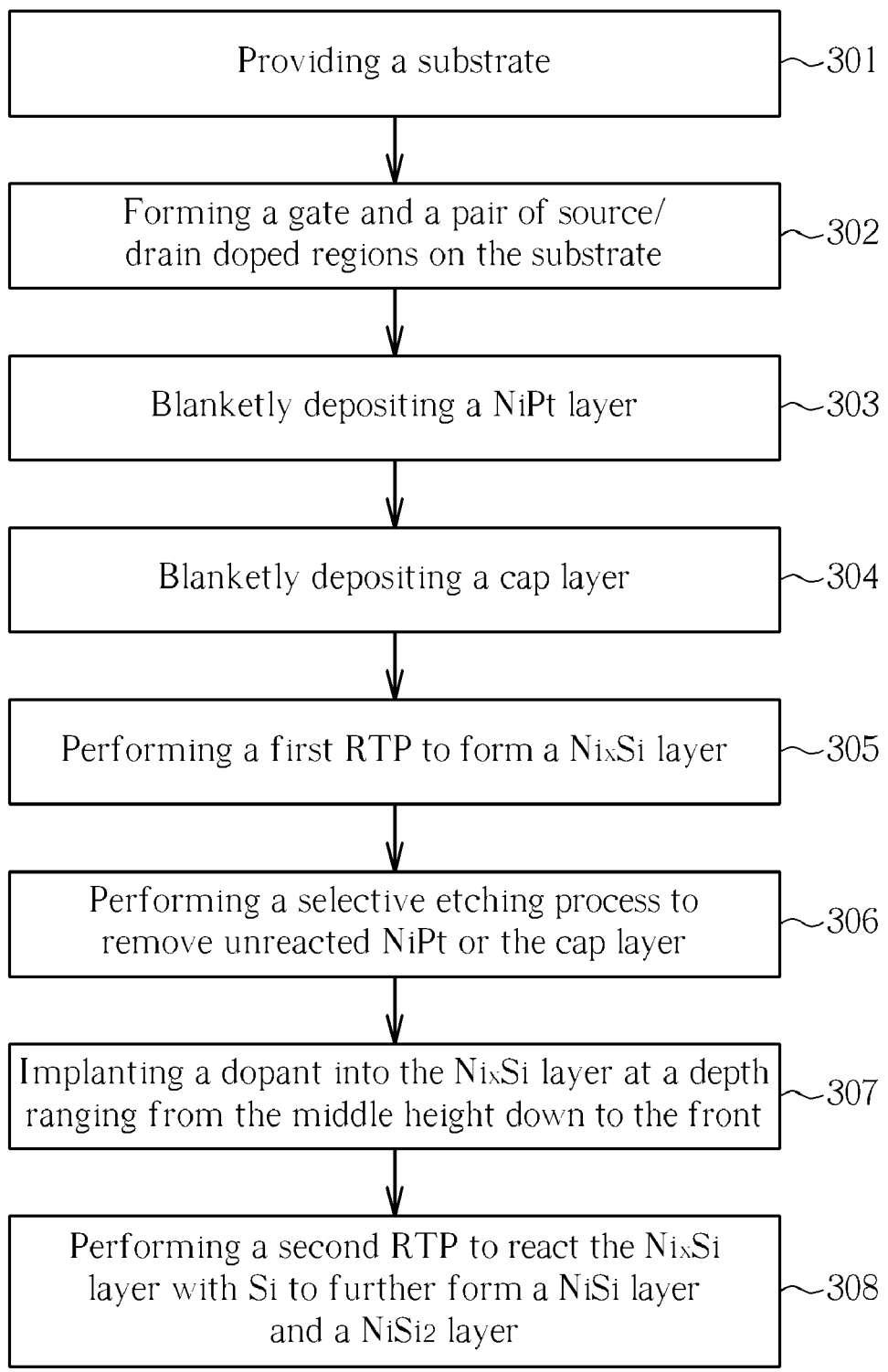
FIG. 1 is a flow chart illustrating an embodiment of the method of making a semiconductor device according to the present invention.
Figure 2:
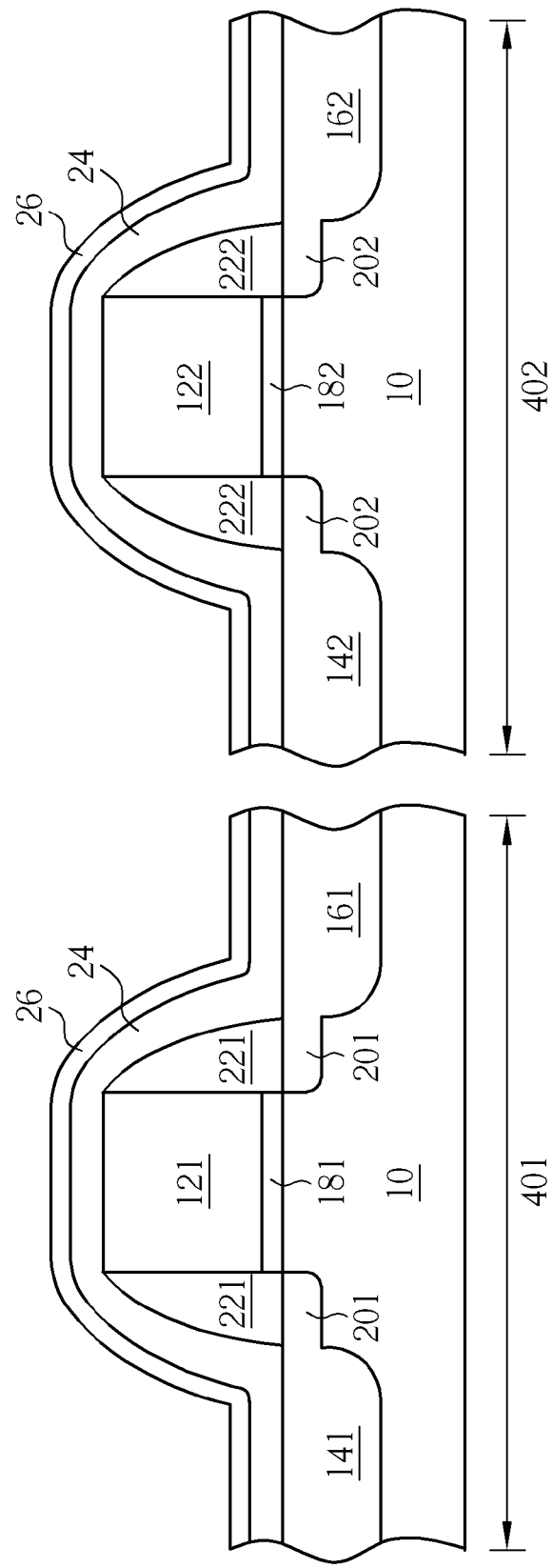
FIGS. 2 to 5 are schematic cross-sectional views illustrating an embodiment as shown by FIG. 1.

Please refer to FIGS. 1 and 2. First, in step 301, a substrate 10, such as a semiconductor substrate, is provided. The substrate 10 may include a first region 401 and a second region 402. Next, a step 302 is performed to form a gate and a pair of source/drain doped regions. As shown in the drawings, a gate 121 and a pair of source/drain doped regions 141 and 161 are formed in the first region 401 of the substrate 10, and a gate 122 and a pair of source/drain doped regions 142 and 162 are formed in the second region 402 of the substrate 10. For variation of MOS structures, the gates 121 and 122 and the source/drain doped regions 141, 161, 142, and 162 may be formed using the material of the substrate or additional material deposited on the substrate. The material may include for example a silicon layer (including single crystal or polycrystalline silicon layer) and may be further properly doped with an n type or p type dopant in accordance with the desired device function. Gate dielectric layers 181 and 182 may be further formed between the gates 121 and 122 and the substrate 10. Lightly-doped regions (LDD) 201 and 202 may be further formed on the substrate 10 at two sides of each of the gates 121 and 122, respectively. Spacers 221 and 222 may be further formed on side walls of the gates 121 and 122.

Thereafter, a pre-cleaning process, such as wet cleaning, may be carried out on the substrate 10. A step 303 is then performed to blanketly deposit a NiPt layer. That is, a NiPt layer 24 is blanketly deposited on the first and second regions 401 and 402 of the substrate 10 to cover the gates 121 and 122 and the source/drain doped regions 141, 142, 161 and 162. It may be accomplished by for example a sputtering process. Thereafter, in a step 304, a cap layer 26 is blanketly deposited on the NiPt layer 24. The cap layer 26 is usually a Ti or TiN layer, which is formed usually by sputtering.

Figure 3:
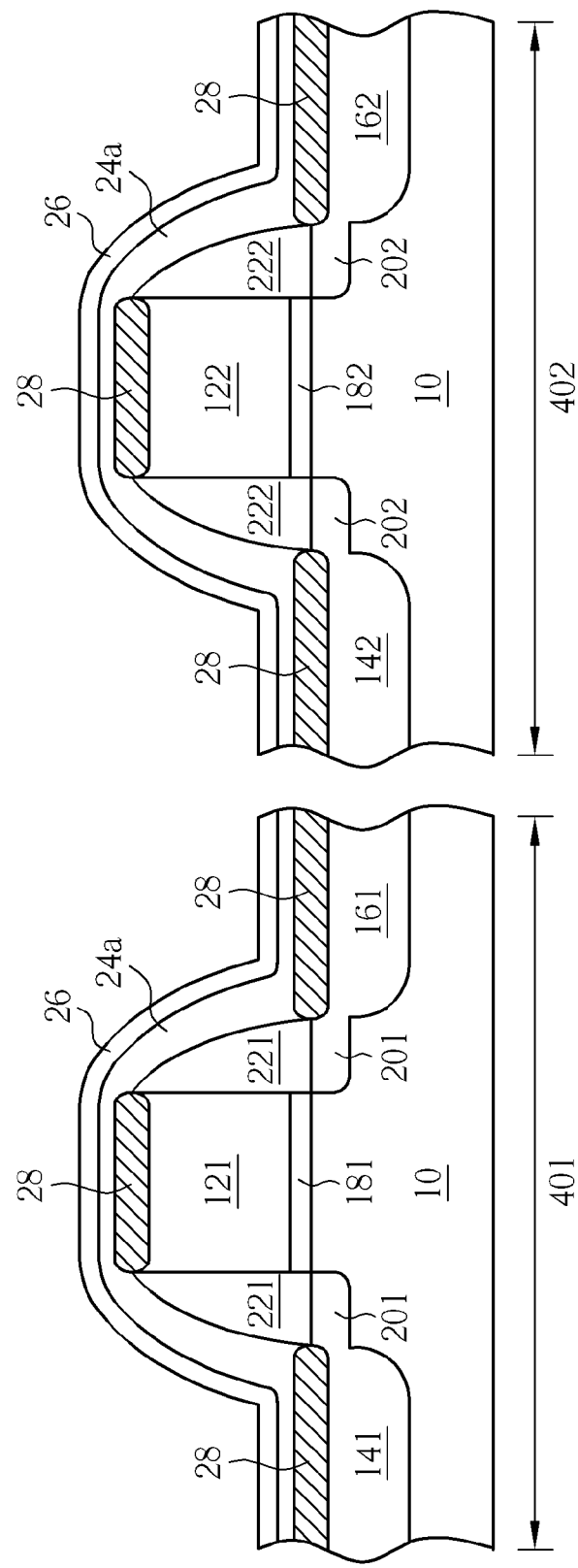

Thereafter, please refer to FIGS. 1 and 3. In a step 305, a first RTP is performed on the substrate 10 to allow Ni of the NiPt layer 24 to react with silicon of the silicon layer of the gates 121 and 122 and the source/drain doped regions 141, 142, 161 and 162 to form a nickel-rich nickel silicide layer ($Ni_xSi$ layer) 28. The component nickel atoms have a number greater than the component silicon atoms. x represents a number in a range from 1.5 to 3. For an embodiment, in which the thickness ratio of Ni layer: Si layer is 1:1.8, the temperature of the first RTP may be carried out at a temperature of for example 200 to 300° C. for such as 60 to 120 seconds by means of soak, forming a $Ni_xSi$ layer having a thickness of about 120 to 130 angstroms. Some NiPt not reacted with silicon may remain as a remaining layer 24a. Thereafter, a step 306 of selective etching process, such as wet etching, is performed to remove the unreacted NiPt. The cap layer 26 is also removed.

Figure 4:
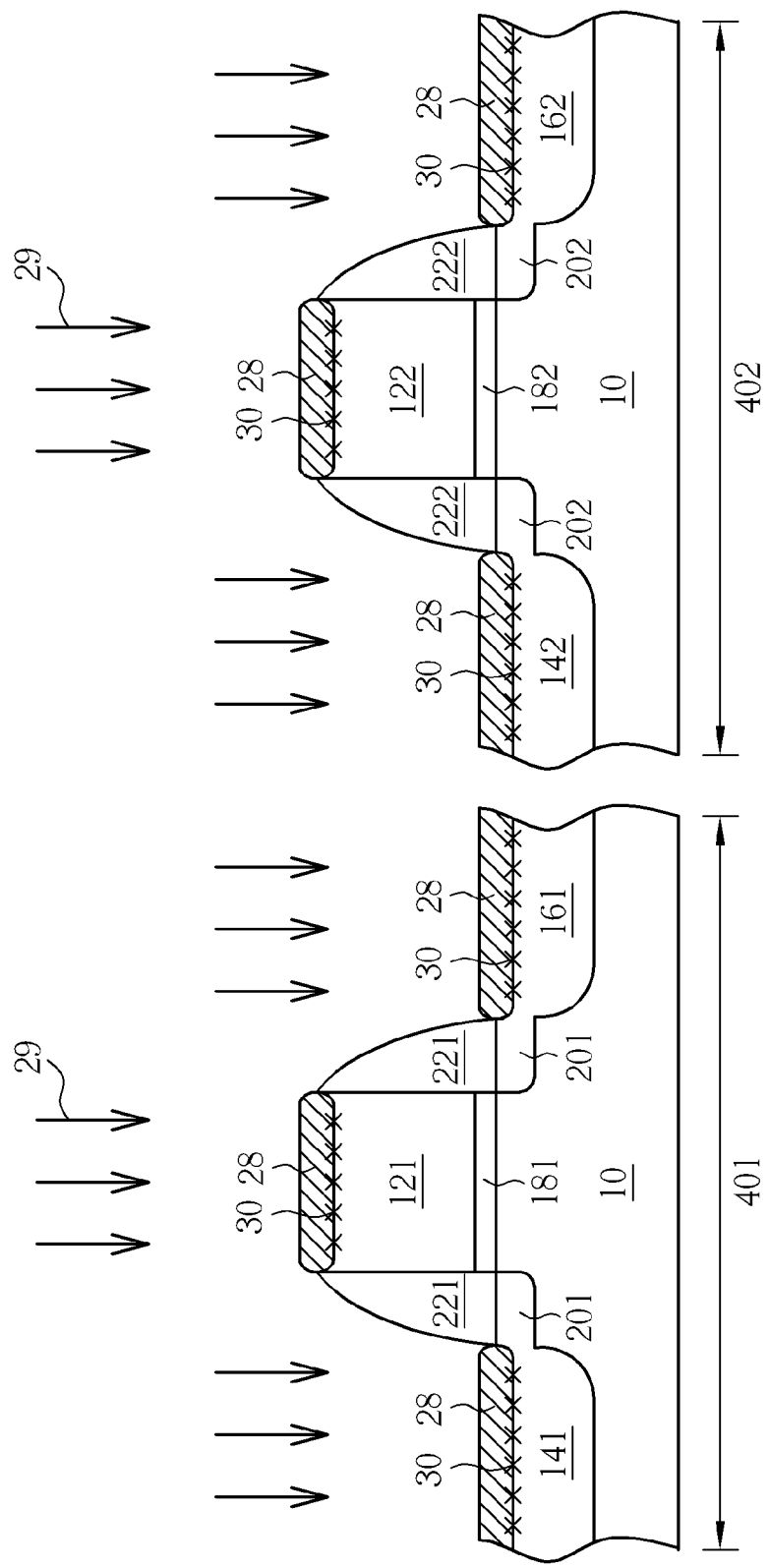
Figure 5:
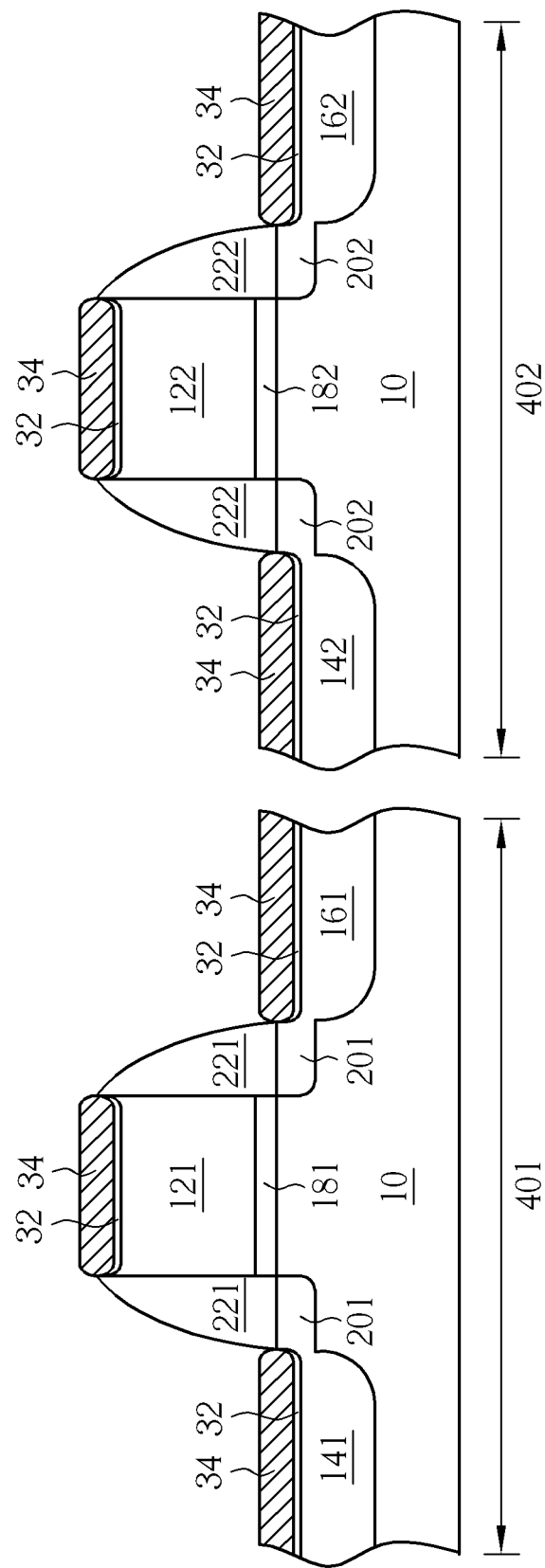

Thereafter, please refer to FIGS. 1 and 4. In a step 307 of ion implantation, a dopant 30 is implanted into the $Ni_xSi$ layer 28 at a depth ranging from a middle height of the $Ni_xSi$ layer 28 down to a front of the $Ni_xSi$ layer 28. Specifically, the dopant 30 may include a dopant commonly utilized in semiconductor manufacturing processes, for example As (arsenic), B (boron), In (indium), N (nitrogen), C (carbon), P (phosphorus) and the like, so as not to increase a burden of process material and have additional metal pollution. It is preferred that the dopant 30 is implanted at the interface of the $Ni_xSi$ layer and the silicon layer, that is, at the front of the $Ni_xSi$ layer in a downward direction. The dopant 30 serves a segregation function to facilitate $NiSi_2$ formation at the interface between the NiSi layer and the silicon layer during the second thermal process. However, it is not limited to implanting the dopant 30 at the interface. Due to its diffusion upon being heated, as shown in FIG. 4, the dopant 30 may be implant into any location between the $Ni_xSi$ layer 28 at a middle height and the front of the $Ni_xSi$ layer 28 contacting the underlying silicon layer. The dopant leads to an improved device performance as compared with conventional techniques.

Figure 6:
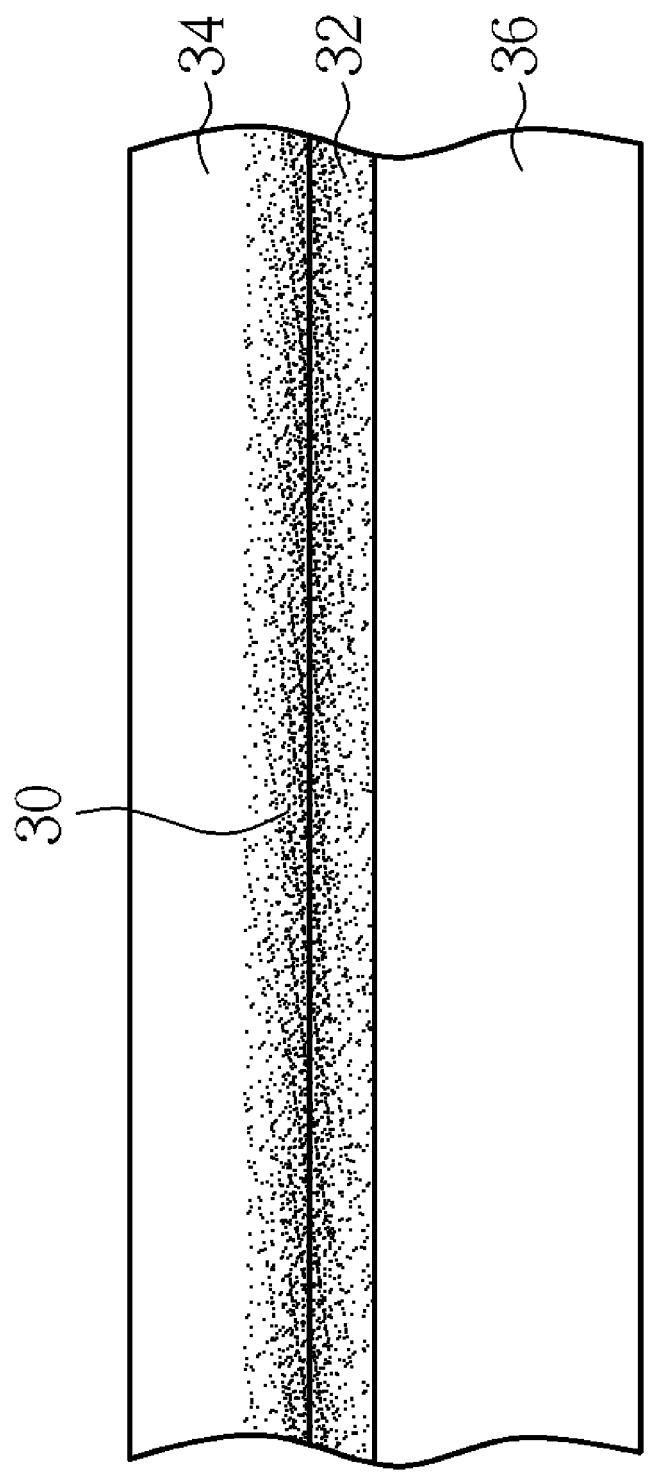
FIG. 6 is a magnified schematic cross-sectional view illustrating a structure of NiSi layer/$NiSi_2$ layer/Si layer in an embodiment of the method of making a semiconductor device according to the present invention.

In a step 308, a second RTP is performed on the substrate 10 to allow the $Ni_xSi$ layer to further react with silicon to form a NiSi layer and a $NiSi_2$ layer disposed between the NiSi layer and the silicon layer. Although the $NiSi_2$ layer has a resistance greater than the NiSi layer, it has a SBH less than the NiSi layer. During the second RTP, Si of the NiSi layer tends to aggregate to grow into crystals. The growth of Si crystals makes the NiSi layer non-continuous, such that and the electric properties are affected. However, in the case of the present invention, the dopant 30 has been implanted into the $Ni_xSi$ layer 28 at a depth ranging from a middle height of the $Ni_xSi$ layer 28 down to the front of the $Ni_xSi$ layer 28, for example as shown in FIG. 4 that the dopant 30 is located at the front of the $Ni_xSi$ layer 28, i.e. between the $Ni_xSi$ layer 28 and the gates 121 and 122 and the source/drain doped regions 141, 142, 161 and 162 , such that the growth of Si crystals can be inhibited and the formed NiSi can have more chance to react with Si at the interface to form $NiSi_2$. As such, referring to FIG. 5, a $NiSi_2$ layer 32 is formed and it is located between the NiSi layer 34 and gates 121 and 122 and the source/drain doped regions 141, 142, 161 and 162. FIG. 6 illustrates a magnified cross-sectional view for the structure of NiSi layer/ $NiSi_2$ layer/Si layer. It is shown that a $NiSi_2$ layer 32 is formed between the NiSi layer 34 and the silicon layer 36. The dopant 30 might be located at the front of the $NiSi_2$ layer 32. Or, the dopant 30 might be encompassed by the NiSi layer 34 and the $NiSi_2$ layer 32, so as to distribute in a region between the NiSi layer 34 at a middle height and the front of the $NiSi_2$ layer 32 and have the type of normal distribution (or referred to as Gaussian distribution), due to diffusion upon being heated during the second RTP.

The second RTP may be performed with a temperature of for example 400 to 600° C. by means of soak for 30 to 60 seconds. A laser annealing for milliseconds maybe further performed, so as to obtain more $NiSi_2$. Or, an RTP spike-annealing process may be performed with a peak temperature of for example 500° C. and a T-50° C. time period of for example 8 seconds.

Figure 7:
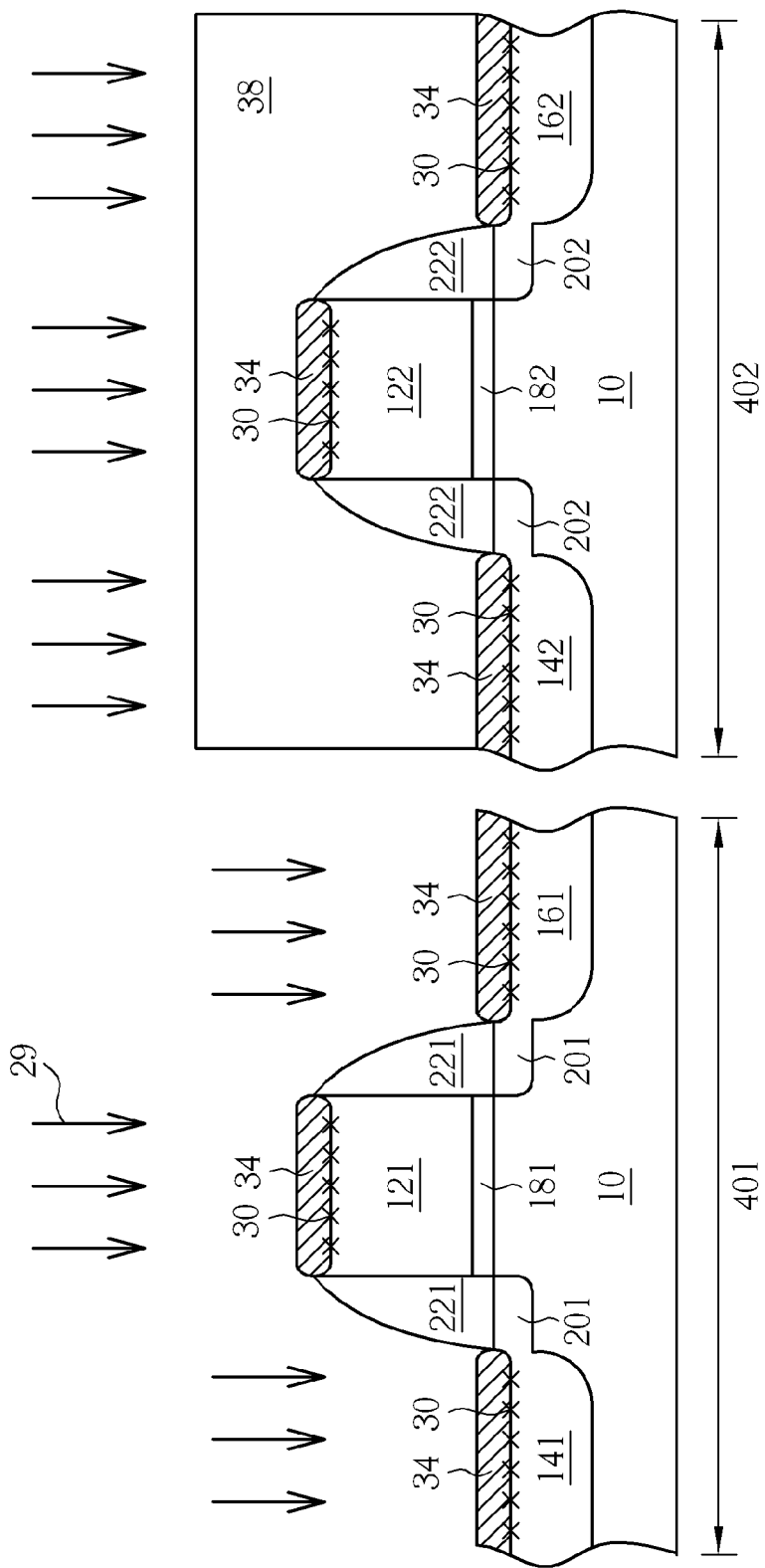
FIG. 7 is a schematic cross-sectional view illustrating another embodiment of the method of making a semiconductor device according to the present invention.

For the aforesaid embodiment, the NMOS and the PMOS transistors may be made at the same time. When the dopant is not used in a large amount, it is not harmful to the PMOS. Yet, it may be performed in the way that the PMOS region is covered with a mask when the dopant implantation is carried out, so as to prevent the dopant from being implanted into the gate and source/drain doped regions of the PMOS transistor. As shown in FIG. 7, structures on the second region 402 are covered with a mask layer 38, followed by an implantation process 29 of the dopant 30 into the first region 401.

Figure 8:
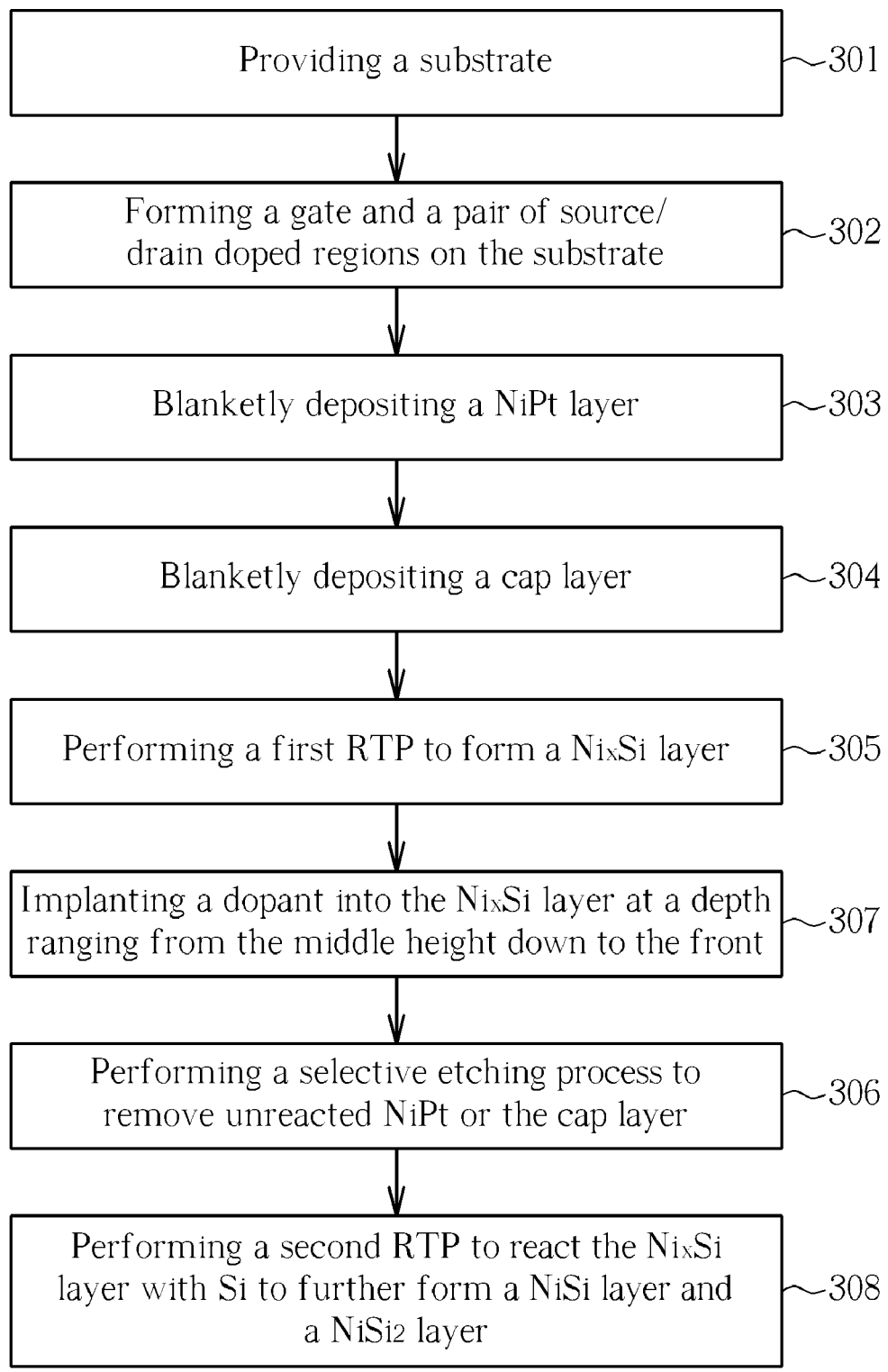
FIG. 8 is a flow chart illustrating a further another embodiment of the method of making a semiconductor device according to the present invention.
Figure 9:
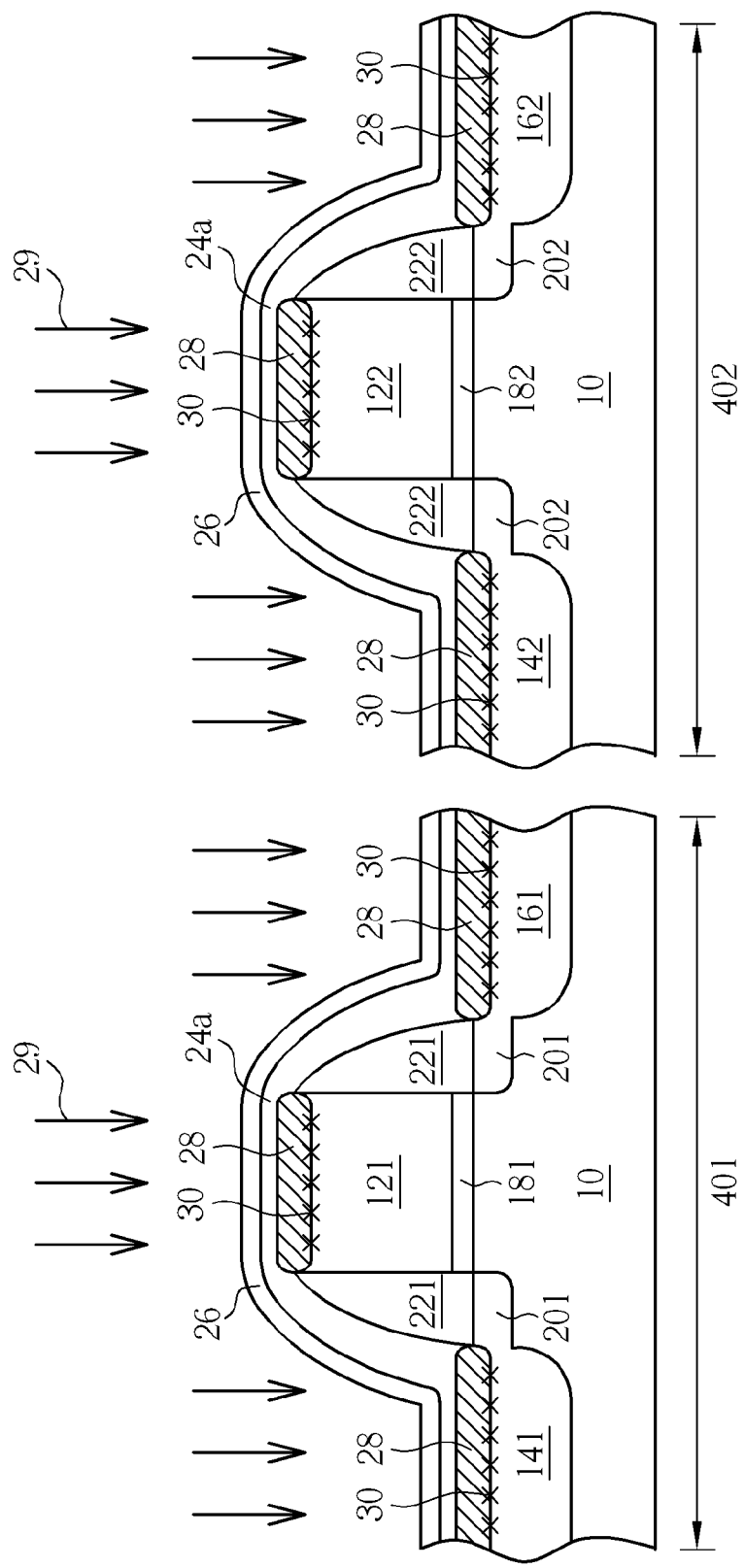
FIG. 9 is a schematic cross-sectional view illustrating an embodiment as shown by FIG. 8.

In the aforesaid embodiment, the step 307 of ion implantation is performed after performing the step 306 of selective etching process and before performing the step 308 of the second RTP. Yet, in accordance with the invention spirit of the present invention, as shown in the flow chart of FIG. 8, the step 307 of ion implantation is also allowed to be performed after the step 305 of the first RTP and before the step 306 of selective etching process. In such process flow, as shown in FIG. 3, the $Ni_xSi$ layer 28 has been formed and the unreacted NiPt remaining layer 24a and the cap layer 26 have not been removed yet. As shown in FIG. 9, the dopant 30 is implanted into the interface between the $Ni_xSi$ layer 28 and the gates 121 and 122 and the source/drain doped regions 141, 142, 161 and 162 through the remaining layer 24a and the cap layer 26. As such, when the later step 308 of the second RTP is performed, a $NiSi_2$ layer 32 can be still effectively formed between the NiSi layer 34 and the gates 121 and 122 and the source/drain doped regions 141, 142, 161 and 162, due to the existence of the dopant 30.

Figure 10:
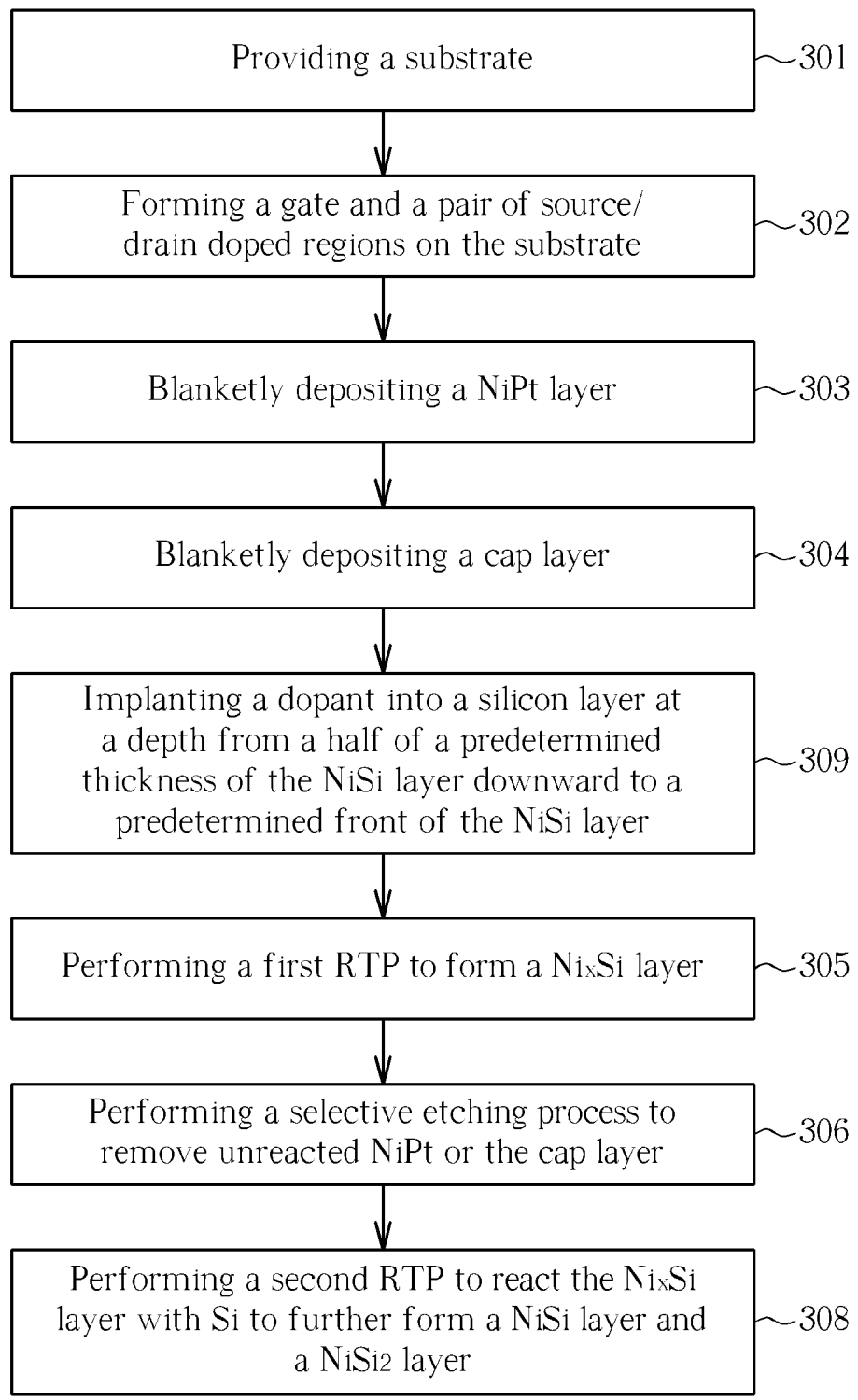
FIG. 10 is a flow chart illustrating a still further another embodiment of the method of making a semiconductor device according to the present invention.
Figure 11:
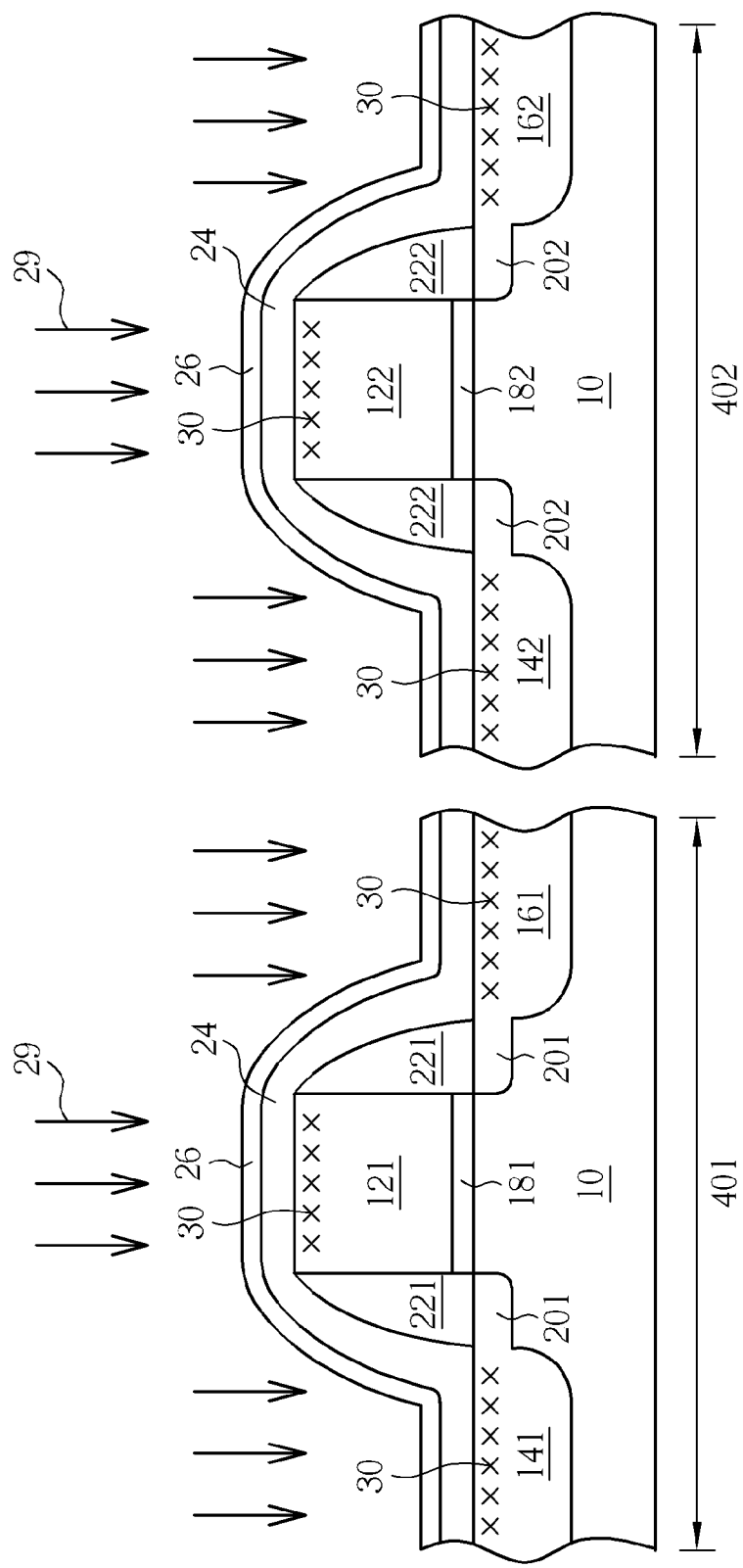
FIG. 11 is a schematic cross-sectional view illustrating an embodiment as shown by FIG. 10.

Alternatively, still in accordance with the invention spirit of the present invention, as shown in the flow chart of FIG. 10, a step 309 of implanting the plant into each silicon layer at a depth ranging from a half of a predetermined thickness of the NiSi layer downward to a predetermined front of the NiSi layer is performed after the step 304 of blanketly depositing the cap layer and before the step 305 of performing the first RTP. In such process flow, because the NiSi layer 34 is not formed yet, the location for the implantation is determined according to the predetermined location of the NiSi layer 34 on the silicon layer. As shown in FIG. 2, the NiPt layer 24 and the cap layer 26 have been formed on the gates 121 and 122 and the source/drain doped regions 141, 142, 161 and 162. Thereafter, as shown in FIG. 11, the implantation process 29 of the dopant 30 is carried out. The predetermined thickness of the NiSi layer depends on the processes and the device size and is usually about 200 angstroms. Accordingly, the dopant 30 may be implanted into the silicon layer at a depth of about 100 angstroms to 200 angstroms from the surface of the silicon layer. As such, when the later step 308 of the second RTP is performed, a $NiSi_2$ layer 32 can be still effectively formed between the NiSi layer 34 and the gates 121 and 122 and the source/drain doped regions 141, 142, 161 and 162, due to the existence of the dopant 30.

It may be noted that, in the method of the present invention, it is preferably to utilize arsenic as the dopant and implant the dopant into the front of the $Ni_xSi$ layer. As such, a $NiSi_2$ layer can be formed between the NiSi layer and the silicon layer of the gate, source/drain doped region after the second RTP is carried out. The dopant is also present in the $NiSi_2$ layer with a relatively high concentration. It indicates that more concentration of the dopant, more $NiSi_2$ formed at the interface between the Si layer and the $Ni_xSi$ layer.

Those skilled in the art will readily observe that numerous modifications and alterations of the device and method may be made while retaining the teachings of the invention.

What is claimed is:
1. A method of making a semiconductor device, comprising:
 providing a substrate;
 forming a gate and a pair of source/drain doped regions on the substrate, wherein the gate and the pair of source/drain doped regions each independently comprise a doped silicon layer;
 blanketly depositing a NiPt layer to cover the gate and the pair of source/drain doped regions;
 blanketly depositing a cap layer on the NiPt layer;
 performing a first rapid thermal process on the substrate to allow Ni of the NiPt layer to react with silicon of the silicon layer to form a $Ni_xSi$ layer, wherein x represents a number in a range from 1.5 to 3;
 performing a selective etching process to remove unreacted NiPt or the cap layer;
 performing a second rapid thermal process on the substrate to allow the $Ni_xSi$ layer to further react with silicon to form a NiSi layer and a $NiSi_2$ layer disposed between the NiSi layer and the silicon layer; and
 performing an ion implantation to implant a dopant into the $Ni_xSi$ layer at a depth ranging from a middle height of the $Ni_xSi$ layer down to a front of the $Ni_xSi$ layer after performing the selective etching process and before performing the second rapid thermal process or after performing the first rapid thermal process and before performing the selective etching process, or to implant the dopant into each silicon layer at a depth ranging from a half of a predetermined thickness of the NiSi layer to a predetermined front of the NiSi layer after depositing the cap layer and before performing the first rapid thermal process.

2. The method of claim 1, wherein the dopant comprises As, B, In, N, C or P.

3. The method of claim 1, wherein the second rapid thermal process comprises a laser annealing process.

4. A method of making a semiconductor device, comprising:
 providing a substrate comprising a first region and a second region;
 forming a first gate and a pair of first source/first drain doped regions in the first region of the substrate, wherein the first gate and the pair of first source/first drain doped regions each independently comprise a first silicon layer which is doped;
 forming a second gate and a pair of second source/second drain doped regions in the second region of the substrate, wherein the second gate and the pair of second source/second drain doped regions each independently comprise a second silicon layer which is doped;
 blanketly depositing a NiPt layer to cover the first gate, the pair of first source/first drain doped regions, the second gate, and the pair of second source/second drain doped regions;
 blanketly depositing a cap layer on the NiPt layer;
 performing a first rapid thermal process on the substrate to allow Ni of the NiPt layer to react with silicon of the first and second silicon layer to form a $Ni_xSi$ layer, wherein x represents a number in a range from 1.5 to 3;
 performing a selective etching process to remove unreacted NiPt or the cap layer;
 performing a second rapid thermal process on the substrate to allow the $Ni_xSi$ layer to further react with silicon to form a NiSi layer and a $NiSi_2$ layer disposed between the NiSi layer and the silicon layer; and
 performing an ion implantation to implant a dopant into the $Ni_xSi$ layer at a depth ranging from a middle height of the $Ni_xSi$ layer down to a front of the $Ni_xSi$ layer after performing the selective etching process and before performing the second rapid thermal process or after performing the first rapid thermal process and before performing the selective etching process, or implant the dopant into each silicon layer at a depth ranging from a half of a predetermined thickness of the NiSi layer to a predetermined front of the NiSi layer after depositing the cap layer and before performing the first rapid thermal process.

5. The method of claim 4, wherein the dopant comprises As, B, In, N, C or P.

6. The method of claim 4, wherein the second rapid thermal process comprises a laser annealing process.

7. The method of claim 4, wherein each first silicon layer which is doped comprises an n type dopant, and each second silicon layer which is doped comprises a p type dopant.

8. The method of claim 7, further, before the dopant is implanted, comprising a step of covering the second region of the substrate with a mask layer to prevent the second region from being implanted with the dopant.

* * * * *